United States Patent
Komuro et al.

(10) Patent No.: US 6,841,820 B2
(45) Date of Patent: Jan. 11, 2005

(54) INFORMATION STORAGE APPARATUS AND MANUFACTURING METHOD THEREFOR

(75) Inventors: Yoshiaki Komuro, Kanagawa (JP); Makoto Moioyoshi, Kanagawa (JP)

(73) Assignee: Sony Corporation, Tokyo (JP)

(*) Notice: Subject to any disclaimer, the term of this patent is extended or adjusted under 35 U.S.C. 154(b) by 0 days.

(21) Appl. No.: 10/451,318

(22) PCT Filed: Oct. 17, 2002

(86) PCT No.: PCT/JP02/10782

§ 371 (c)(1),
(2), (4) Date: Jun. 19, 2003

(87) PCT Pub. No.: WO03/036726

PCT Pub. Date: May 1, 2003

(65) Prior Publication Data

US 2004/0052131 A1 Mar. 18, 2004

(30) Foreign Application Priority Data

Oct. 24, 2001 (JP) ........................................ 2001-325803

(51) Int. Cl.[7] ............................................. H01L 29/76
(52) U.S. Cl. ...................... 257/295; 257/298; 257/301; 257/303; 257/306; 257/324; 438/3; 438/240
(58) Field of Search .................... 257/68, 71, 295–314, 257/324–326; 438/3, 240

(56) References Cited

U.S. PATENT DOCUMENTS 6,104,633 A * 8/2000 Abraham et al. ........... 365/171
6,535,453 B2 * 3/2003 Nii et al. ................. 365/230.05

FOREIGN PATENT DOCUMENTS

JP 2001-168418 A 6/2001
JP 2001168418 A * 6/2001 ........... H01L/43/12

* cited by examiner

Primary Examiner—David Nelms
Assistant Examiner—Andy Huynh
(74) Attorney, Agent, or Firm—Robert J. Depke; Holland & Knight LLP (57) ABSTRACT

The invention achieves the fine processing of an information writing device, which includes a multilayered element obtained by stacking ferromagnetic/semiconductor/ferromagnetic layers, without increasing the resistivity and power consumption of the device and lowering the reliability thereof. The invention provides an information storage apparatus (1) having write word lines (11), bit lines (21) formed in such a way as to intersect with the write word lines (11) at predetermined intervals, and information storage devices (31) each comprising a multilayered film including a magnetic layer provided in an intersection region, in which each of the write word lines (11) intersects with an associated one of the bit lines (21), between the write word lines (11) and the bit lines (21). The information storage devices (31) each have a concave portion (54), which is provided in a second insulating film (53) formed between the write word line (11) and the bit line (21) in the intersection region between the word line (11) and the bit line (21), and a multilayered film including at least a magnetic layer formed in the concave portion (54).

10 Claims, 4 Drawing Sheets

INFORMATION STORAGE APPARATUS AND MANUFACTURING METHOD THEREFOR

This application claims priority to International Application No. PCT/JP02/10782, filed Oct. 17, 2002 and Japanese Patent Application No. JP2001-325803, filed Oct. 24, 2001, each of which are incorporated herein by reference.

TECHNICAL FIELD

The present invention relates to an information storage device and to a manufacturing method therefor. More particularly, the invention relates to an information storage device constituted by a magnetoresistance effect device, which controls the magnetization direction of a magnetization region formed of a ferromagnetic material by applying an external magnetic field thereto, and also relates to a manufacturing method therefor.

BACKGROUND ART

Rapid proliferation of information communication equipment, especially, small devices for personal use, such as portable terminals, has demanded further enhancement of performance, for example, higher integration, higher speed, and lower power consumption of constituent devices, such as memory devices and logic devices, thereof. Especially, the improvements in high density and high capacity of nonvolatile memories have become important as techniques for replacing hard disks and optical disks, the miniaturization of each of which is inherently impossible due to the presence of moving parts.

Flash memory using a semiconductor, and FRAM (Ferroelectric Random Access Memory) using ferroelectric substance are cited as nonvolatile memories. However, the flash memory has drawbacks in that the high integration of the flash memory is difficult because of complexity in structure thereof, and that an access time is 100 nm or so and thus slow. On the other hand, it is pointed out that FRAM has a drawback in that the possible number of rewritable times is small.

Nonvolatile memory attracting attention as having no such drawbacks is, for instance, a magnetic memory referred to as MRAM (Magnetic Random Access Memory) or MR (Magnetic resistance) memory, which is described in an article by Wang et al., IEEE Trans. Magn. 33 (1997) p448. Because MRAM has a simple structure, high-integration thereof is easily achieved. Further, writing is performed thereon by rotation of a magnetic moment, so that, the possible number of rewriting times is expected to be large. Furthermore, even with regard to the access time that was a problem just after the proposal of MRAM, however, a high output can be obtained by utilization of TMR (Tunnel Magnetic Resistance) effects, so that access time is, nowadays, considerably improved.

However, MRAM has an essential problem in structure. Writing in MRAM is performed by causing a current magnetic field, which is generated by supplying current to wiring, to rotate magnetization of a recording layer. Nevertheless, as the wiring becomes thinner due to the high integration, the critical current value of current that can be supplied to a write line decreases, so that the magnitude of an obtained magnetic field decreases. Thus, the coercive force of a recorded region should be reduced. This means that the reliability of the information writing device lowers. Further, it is considered that because a magnetic field cannot be converged different from light and electron beams, the magnetic field is a principal cause of a crosstalk in the case of achieving the high integration. Although a keeper structure has been proposed so as to prevent an occurrence of this situation, the complication of the structure of MRAM is unavoidable. As above-described, writing utilizing the current magnetic field essentially has many problems and may cause major drawbacks of MRAM in future.

Meanwhile, such drawbacks can be solved in the case that magnetization can be controlled without using a magnetic field. Further, a technique of stacking and using ferromagnetic/semiconductor/ferromagnetic layers as means for controlling magnetization without using a magnetic field, as described by Mattson et al., Phys. Rev. Lett. 77 (1993) p. 185.

This utilizes the fact that magnetic coupling between ferromagnetics depends upon the carrier concentration of the semiconductor layer serving as an intermediate layer. In a multilayered element obtained by stacking the ferromagnetic/semiconductor/ferromagnetic layers, the magnetic coupling between the ferromagnetic layers can be changed, for example, from a parallel one to an antiparallel one by controlling the carrier concentration of the semiconductor layer serving as an intermediate layer. Thus, when the magnitude of the coercive force of one (that is, a fixed layer) of the ferromagnetic layers is set to be large, the magnetization of the other ferromagnetic layer (that is, a movable layer) can be turned with respect to the fixed layer. Especially, a method of turning the magnetization by utilizing an electrical input is promising as a technique for realizing a compact all-solid-state device.

Various structures of such information writing devices are reported. To cite one example, there is a structure in which various kinds of films including magnetic films serving as constituent elements of the information writing devices are stacked in such a way as to be parallel to bit lines and word lines, as disclosed in Japanese Patent Application Laid-Open No. Hei 11-317071. Method of manufacturing such a structure is to form various kinds of films including magnetic films, which serve as constituent elements of the information writing device, and to thereafter shape the films into a predetermined form, such as a rectangle, by utilizing a photolithography technique and a dry-etching technique.

However, it is becoming difficult to finely work such structures, which includes a multi-layered film necessary to be finely processed in manufacturing a multilayered element obtained by stacking ferromagnetic/semiconductor/ferromagnetic layers, with high precision. Furthermore, with the fine processing of the multilayered film, the required area of the information writing device cannot be secured. This results in increase in the resistivity of the device and the power consumption thereof and also results in degradation of the reliability thereof. Problems of the invention are to solve the difficulties of a method of manufacturing the above-mentioned conventional structure, and to manufacture information writing devices at low cost with high precision.

DISCLOSURE OF THE INVENTION

According to an information storage apparatus of the present invention, an information storage device is constituted by a multilayered film formed in such a way as to be filled in a concave portion. Thus, as compared with the information writing device of the conventional multilayered structure, the contact area between a magnetization fixed layer and a tunnel insulating layer or between the tunnel insulating layer and a storage layer of the device of the invention can be set to be large when the comparison is made on condition that the occupied areas of the devices are equal to each other. That is, the resistance value of each of the information writing devices can be reduced. This enables reduction in the size, voltage, and power consumption of the device.

According to a method of manufacturing an information storage apparatus of the invention, a concave portion, in which each of the information writing devices is formed, can be formed by performing etching of a second insulating film of a single layer, which is easy to perform as a dry etching technique. Thus, a load on a manufacturing process can be reduced. Further, as compared with the information writing device of the conventional multilayered structure, the contact area between the magnetization fixed layer and the tunnel insulating layer or between the tunnel insulating layer and the storage layer of the device manufactured by the method according to the invention can be set to be large when the comparison is made on condition that the occupied areas of the devices are equal to each other. That is, the resistance value of each of the information writing devices can be reduced. This enables reduction in the size, voltage, and power consumption of the information storage device.

BEST MODE FOR CARRYING OUT THE INVENTION

Figure 1A:
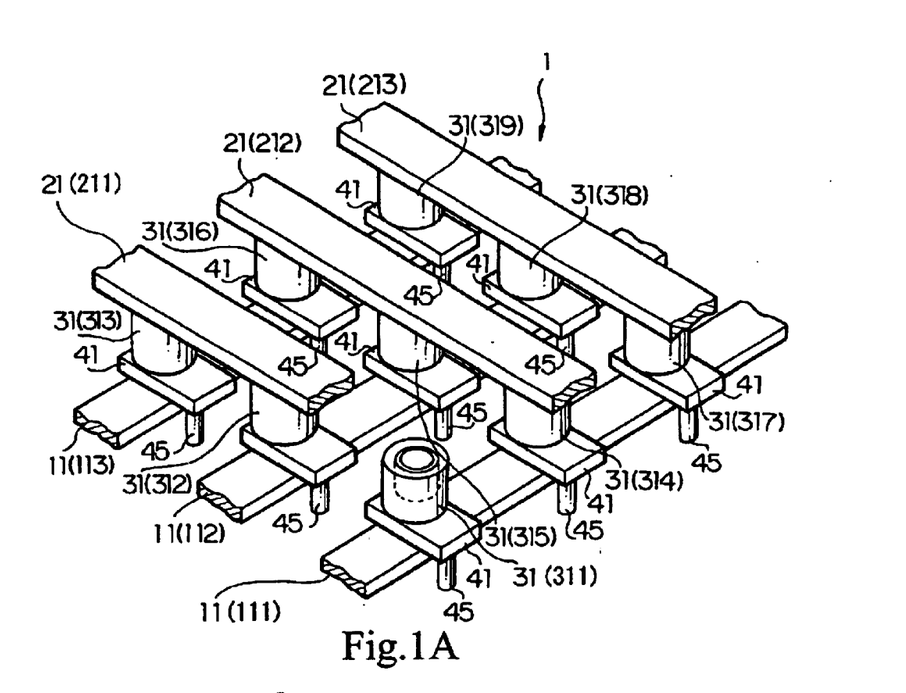
FIG. 1A is a perspective partially sectional view showing a primary part of a first mode for carrying out of an information storage apparatus according to the invention.
Figure 1B:
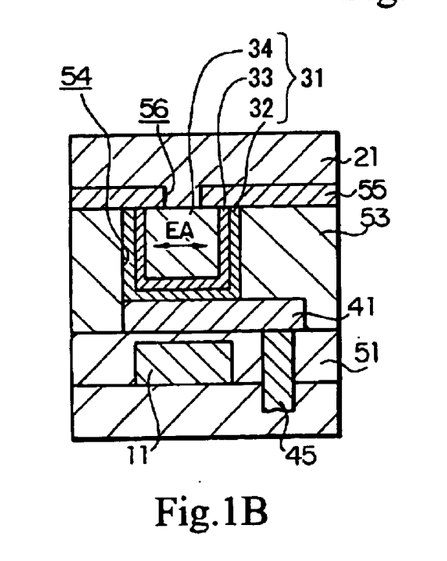
FIG. 1B is a sectional configuration view of an information storage device.
Figure 1C:
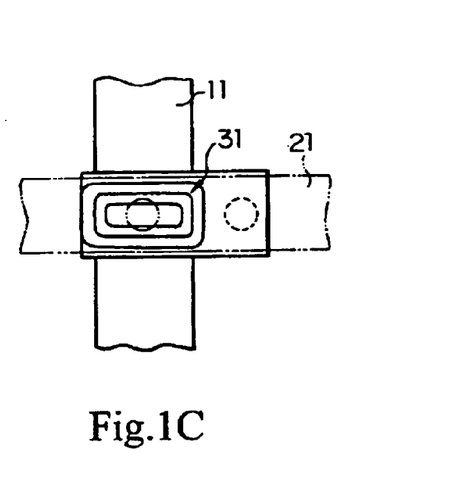
FIG. 1C is a layout view showing a layout of a write word line, an information storage device, and a bit line.

First mode for carrying out of an information storage apparatus according to the invention is described hereinbelow with reference to FIGS. 1A to 1C. FIG. 1A is a perspective partially sectional view showing a primary part of the information storage apparatus. FIG. 1B is a sectional configuration view of an information storage device. FIG. 1C is a layout view showing a layout of a write word line, an information storage device, and a bit line. Incidentally, the drawing of a read circuit portion is omitted.

As shown in FIG. 1A, the word lines 11 (111, 112, 113) are, for instance, arranged in parallel on the same plane. Bit lines 21 (211, 212, 213) are arranged in parallel on the same plane in such a way as to be spaced a predetermined distance away from and perpendicular to these write word lines 11.

Further, information writing devices 31 (311 to 319) are placed at positions at which the word lines 11 intersect with the bit lines 21. These information writing devices 31 are each constituted bya magnetic tunnel junction device (MTJ device (MTJ is an abbreviation of Magnetic Tunnel Junction)) or a tunnel magnetic resistance device (TMR device (TMR is an abbreviation of Tunnel Magnetic Resistance)).

Electrically conductive layer 41 including an antiferromagnetic layer is formed on a surface of each of the information writing devices 31, which is at the side of the write word line 11. Each of the conductive layers 41 is connected to a contact 45 connected to a read circuit (not shown).

Next, the detail of the configuration of the information storage device 31 is described by referring to FIG. 1B.

Between the write word lines 11 and the bit lines 21, a first insulating film 51, which is formed in such a way as to cover the write word lines 11, and a second insulating film 53 formed on this first insulating film 51 are provided.

On the first insulating film 51 including intersection regions (as seen in a plan view) between the word lines 11 and the bit lines 21, the conductive layers 41 each including an antiferromagnetic layer are formed. These conductive layers 41 are each connected to the contact 45 connected to a read circuit (not shown).

Further, in the second insulating film 53 in each of the intersection regions between the write word lines 11 and the bit lines 21, a concave portion 54 having a bottom part, to which the conductive layer 41 is exposed, is formed. In this concave portion 54, the information storage device 31 is formed. That is, a multilayered film consisting of a magnetization fixed layer 32 formed from, for example, a ferromagnetic, a tunnel insulating layer 33, and a storage layer 34 formed from a ferromagnetic, which are arranged in this order from the wall surface of the concave portion, is formed therein. This multilayered film constitutes the information storage device 31. Furthermore, the storage layer 34, which is a top layer, is completely filled in the concave portion 54.

The magnetization fixed layer 32 is formed from, for instance, ferrocobalt (CoFe). The tunnel insulating layer 33 is formed from, for example, alumina oxide ($AlO_3$). The storage layer 34 is formed from, for instance, ferrocobalt (CoFe). Further, the conductive layer 41 is constituted by a multilayered element consisting of a barrier layer and an antiferromagnetic layer, which are arranged in this order from the side of the write word line 11. The barrier layer is formed from, for example, titanium nitride, tantalum, or tantalum nitride. The antiferromagnetic layer is formed from, for instance, platinum manganese (PtMn) or ferromanganese (MnFe). Furthermore, the storage layer 34 is formed in such a manner as to have a preferred axis for a magnetization direction, which is an easy axis of magnetization (EA).

In this mode for carrying out, a third insulating film 55 is formed on the second insulating film 53 in such a manner as to cover the information storage device 31. In the third insulating film 55 formed on the information storage device 31, an opening portion 56 is formed. Incidentally, it is not always necessary to form the third insulating film 55.

On the third insulating film 55, the bit line 21 is formed in such a way as to be spaced a predetermined distance away from the write word line 11. This bit lines 21 is connected to the storage layer 34 of the information storage device 31 through the opening portion 56.

In the information storage apparatus 1, the multilayered film constituting the information storage device 31, that is, the magnetization fixed layer 32, the tunnel insulating layer 33, and the storage layer 34 are formed in such a manner as to be filled in the concave portion 54. Thus, as compared with the conventional information writing device of the multilayered structure, this embodiment can set the contact area between the magnetization fixed layer 32 and the tunnel insulating layer 33 or between the tunnel insulating layer 33 and the storage layer 34 to be large. That is, the resistance value of each of the information writing device 31 can be reduced. This enables reduction in the size, voltage, and power consumption of the device.

When writing information to the information writing device 31, this device generates a magnetic field by supplying electric current to the write word line 11 and the bit line 21 to thereby write a direction of the magnetic field in the storage layer 34 constituted by a ferromagnetic layer in the information writing device 31.

On the other hand, when reading information therefrom, a voltage is applied between the bit line 21 and the contact 45. Then, recorded information is fetched by detecting a sensing current that flows therein. The information writing device 31 utilizes the fact that the resistance value thereof is changed by writing digital data representing 0 and 1 thereto.

Next, the principle of changing the resistance value is described hereinbelow. There are two possible directions as the direction of magnetization of the storage layer 34 along the easy axis of magnetization. This defines the two states of the information writing device 31. These two directions include a certain direction and a direction obtained by reversing the certain direction by 180 degrees.

On the other hand, the magnetization fixed layer 32 can be formed in such a way as to have only one preferred magnetization direction that is a unidirectional anisotropy direction. This direction is fixed by applying a strong magnetic field thereon or deriving a crystallographic composition, during heating up to a temperature higher than a blocking resistance temperature (normally ranging from 150° C. to 300° C. (in this embodiment, 250° C.)), in such a way as to be parallel to the easy axis of magnetization of the storage layer 34.

Generally, the direction of the axis of magnetization of the magnetization fixed layer 32 and the storage layer 34 is set to that of a long side of a structure constituting each of these layers. For example, in the configuration shown in FIG. 1B, when the easy axis of magnetization EA is set to a horizontal direction (that is, the direction of an arrow), as viewed in the figure, the information writing device 31 is adapted to have a rectangular structure, whose longer side extends along the direction of the bit line 21, as shown in FIG. 1C. The ratio of the length of the longer side to that of the shorter side ranges from 1.5 to 4. Preferably, this ratio ranges from 2 to 3.

Figure 2A:
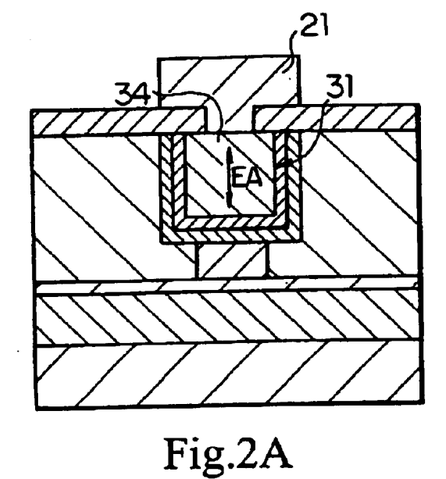
FIG. 2A is a view illustrating a configuration of the device in the case that an axis of magnetization is set in such a way as to extend in a direction perpendicular to a substrate.
Figure 2B:
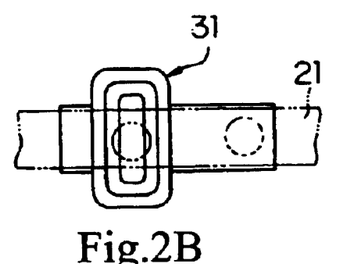
FIGS. 2B and 2C are layout views showing layouts of the write word line, the information storage device, and the bit line.

On the other hand, in the case that the easy axis of magnetization EA of the storage layer 34 of the information storage device 31 is set to be a perpendicular direction (that is, the direction of an arrow), as shown in FIG. 2A, the information writing device is adapted to have an oblong structure, as shown in FIG. 2B so that the longer side thereof extends in a direction perpendicular to the bit line 21, as seen in a plan view thereof. The ratio of the length of the longer side to that of the shorter side ranges from 1.5 to 4. Preferably, this ratio ranges from 2 to 3.

Figure 2C:
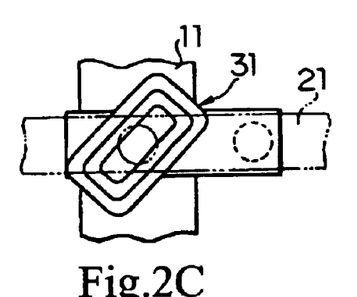

Although the case of setting the direction of the axis of magnetization to a horizontal direction is described in the description of this mode for carrying out is described, the direction of the axis of magnetization is not necessarily limited to the horizontal direction. For instance, as above-described by referring to FIGS. 2A and 2B, the axis of magnetization can be set in such a way as to extend in the perpendicular direction according to the direction of arrangement of the bit line 21 and the write word line 11. Incidentally, as shown in FIG. 2C, the information storage device 31 can be disposed in such a manner as to form an angle with each of the write word line and the bit line, as seen in a plan view thereof.

Next, regarding the case of writing information to the information storage device 31, a magnetic field is generated by supplying current to the write word line 11 and the bit line 21. This generated magnetic field can determine the direction of the magnetic field in the storage layer 34 of the information writing device 11. However, this generated magnetic field cannot change the direction of a magnetic field in the magnetization fixed layer 32.

The once determined direction of the magnetic field does not return to a previous state even if the currents on the write word line 11 and the bit line 21 are shut off, so that the magnetic field can be held. Then, the magnetic field generated around the write word line 11 and the bit line 21 is changed by reversing both or one of the directions of currents respectively flowing in the lines 11 and 21. The change in the magnetic field results in reversion of the direction of the magnetic field in the storage layer 34. Even when the currents flowing in the write word line 11 and the bit line 21 are shut off, the direction of the magnetic field does not return to the previous state, so that the magnetic field can be held.

Figure 3A:
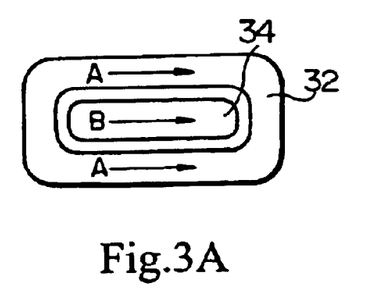
FIG. 3A is a view illustrating a manner in which a direction of magnetization of a storage layer along an axis of easy magnetization is a parallel direction.
Figure 3B:
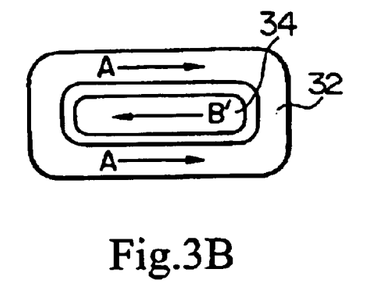
FIG. 3B is a view illustrating a manner in which the direction of magnetization of the storage layer along the axis of easy magnetization is an antiparallel direction.

As above-mentioned, there are two possible directions of magnetization of the storage layer 34 along the easy axis of magnetization. When the direction of magnetization of the storage layer 34 is the same as that of magnetization of the magnetization fixed layer 32 (see the direction of arrows A and B) as illustrated in FIG. 3A, such directions are referred to as parallel directions (incidentally, such a state is referred to as a parallel state). When the direction of magnetization of the storage layer 34 and that of magnetization of the magnetization fixed layer 32 (see the directions of arrows A and B') are opposite to each other by 180 degrees as illustrated in FIG. 3B, such directions are referred to as antiparallel directions (incidentally, such a state is referred to as an antiparallel state). When the direction of the magnetic field in the storage layer 34 and the direction of the magnetic field in the magnetization fixed layer 32 are brought into a parallel state, the probability of passage of electrons through the tunnel insulating layer 33 increases. That is, the resistance value decreases. Conversely, when such directions are put into an antiparallel state, the probability of passage of electrons through the tunnel insulating layer 33 decreases. That is, the resistance value increases. Thus, when a voltage is applied across this information writing device 31, that is, applied between the bit line 21 and the contact 45, a difference in the current flowing through this information writing device 31 is caused by changing the direction of the magnetic field in the storage layer 34. Consequently, two bit statuses (that is, 0 or 1) of the information writing device 31 are clearly defined by the direction of magnetization of this storage layer 34.

Next, a method of manufacturing an information writing device according to the above-described first mode for carrying out is described by referring to manufacturing-process sectional views of FIGS. 4A to 4G.

Figure 4A:
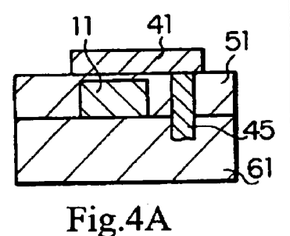
FIGS. 4A to 4G are manufacturing-process sectional views showing a first mode for carrying out of a method of manufacturing an information storage apparatus according to the invention.

As shown in FIG. 4A, transistor devices (not shown) of the read circuit are formed on a semiconductor substrate (not shown). A foundation insulating film 61 for covering the semiconductor devices is also formed thereon. After forming a film for forming the write word lines on this foundation insulating film 61, thus formed film is processed into the write word lines 11 by using lithography and etching techniques. Thereafter, the first insulating film 51 for covering the write word lines 11 is formed. Then, the surfaces of the first insulating film 51 is planarized. This planarization is performed by, for example, chemical mechanical polishing, etching-back or the like.

Incidentally, although not shown, the write word lines 11 can be formed into a groove wiring structure by using groove wiring techniques. That is, the first insulating film 51 is formed on the foundation insulating film 61. Surfaces of the first insulating film 51 are preliminarily planarized. Subsequently, grooves for forming the write word lines are formed in the first insulating film 51 by using lithography and etching techniques. Then, after the material layers of the write word lines are filled in the grooves, then excessive material layers are removed by, for example, chemical mechanical polishing. Thus, the write word lines 11 are formed in a groove wiring structure. Then, the insulating film for covering the write word lines 11 is formed in the first insulating film 51.

Subsequently, a first contact 16 serving as one of terminals of each of the first information storage devices is formed on the first insulating film 51. A method of forming the first contact 16 is performed as follows. That is, connecting holes are first formed by the lithography and etching techniques in such a way as to extend from the first insulating film 51 toward the lower transistor devices (not shown). Then, in the connecting holes, the barrier layers are formed when needed. Subsequently, electric conductors are filled in the connecting holes to thereby form a plug. When the conductors and the barrier layers are formed on the first insulating film 51, excessive conductors and barrier layers on the first insulating film 51 are removed.

Then, a contact 45 connected from the first insulating film 51 to a read circuit portion is formed. One end of this contact 45 serves as one of terminals of the information writing device. A method of forming the contact 45 is performed as follows. That is, connecting holes are formed by using lithography and etching techniques. Then, electric conductors are filled in the connecting holes. Thereafter, excessive conductors on the first insulating film 51 are removed.

Subsequently, the electrically conductive layer 41 is formed on the first insulating film 51 by using film-making techniques, such as a chemical vapor deposition (hereunder referred to as CVD (CVD is an abbreviation of Chemical Vapor Deposition) method and a physical vapor deposition (hereunder referred to as PVD (PVD is an abbreviation of Physical Vapor Deposition)) method. The conductive layer 41 is formed by arranging the barrier layer and the antiferromagnetic layer in this order from a lower layer. The barrier layer is formed from a material, for instance, titanium nitride, tantalum, or tantalum nitride. The antiferromagnetic layer is formed from an antiferromagnetic material, for instance, platinum manganese (PtMn), or a ferromanganese (FeMn). Thereafter, the conductive layer 41 is processed by using lithography and etching techniques into a state in which the conductive layer 41 is connected to an end of the contact 45 from the position on the insulating film 51 above the write word line 11. Incidentally, this conductive layer 41 is electrically insulated by the first insulating film 51 from the write word line 11.

Figure 4B:
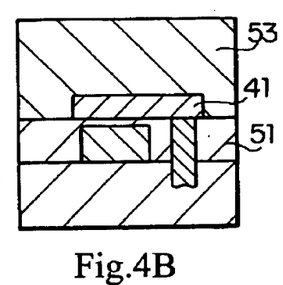

Subsequently, as illustrated in FIG. 4B, the second insulating film 53 for covering the conductive layer 41 is formed on the first insulating film 51 by the CVD method.

Figure 4C:
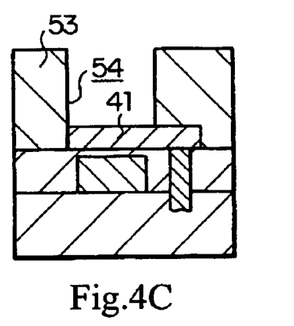

Then, as shown in FIG. 4C, the concave portion 54 leading to the conductive layer 41 is in the second insulating film 53 on the conductive layer 41. This concave portion 54 is processed by using lithography and etching techniques.

Figure 5A:
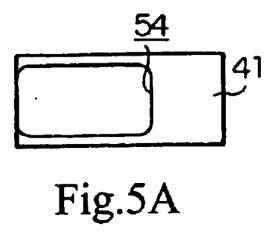
FIGS. 5A to 5C are layout views showing examples of a layout of a concave portion.
Figure 5B:
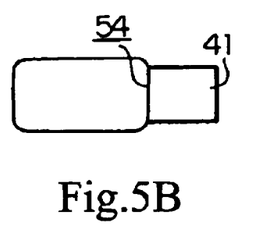
Figure 5C:
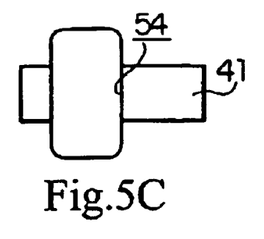

The concave portion 54 is formed so that the shape thereof viewed from above (that is, from the opening-side) has an aspect ratio of a rectangle, an ellipse, or an oval. Further, an example of a position, at which the concave portion 54 is formed, with respect to the conductive layer (that is, the antiferromagnetic layer) 41 is illustrated in FIG. 5A. That is, as viewed in this figure, the concave portion 54 is formed to one side of the conductive layer (the antiferromagnetic layer) 41 in such a way as to be smaller than the conductive layer 41. Alternatively, as illustrated in FIG. 5B, the concave portion 54 is formed to one side of the conductive layer (the antiferromagnetic layer) 41 in such a way as to be larger than the conductive layer 41. Alternatively, as viewed in FIG. 5C, the concave portion 54 is formed to one side of the conductive layer (the antiferromagnetic layer) 41 in such a way as to traverse the conductive layer 41.

Regarding etching for forming the concave portion 54, for instance, in the case that the concave portion 54 can be fit within the conductive layer 41, it is preferable to set a condition ensuring a desirable selective ratio between the second insulating film 53 and the conductive layer (the antiferromagnetic layer) 41, that is, a condition making it difficult to etch the antiferromagnetic layer. An example of such a condition is to use a mixed gas of tetrafluoromethane ($CF_4$), trifluoromethane ($CHF_3$), and Argon (Ar) or a mixed gas of octafluorocyclobutane ($C_4F_8$), oxygen ($O_2$), and argon (Ar) as an etching gas.

Further, in the case that the concave portion 54 cannot be fit within the conductive layer 41, it is preferable to set a condition ensuring a desirable selective ratio between the second insulating film 53 and each of the conductive layer 41 and the first insulating film 51, that is, a condition making it difficult to etch the antiferromagnetic layer and the first insulating film 51. However, because each of the first insulating film 51 and the second insulating film 53 uses oxide film, usually, a desirable selective ratio is not obtained. In such a case, an insulating film, such as a nitride film, ensuring a desirable selective ratio and having a thickness of 10 nm or so is formed on the first insulating film 51. Then, this film is used as a stopper layer. Further, the second insulating film 53 is etched by a mixed gas of octafluorocyclobutane ($C_4F_8$), oxygen ($O_2$), and argon (Ar).

Figure 6:
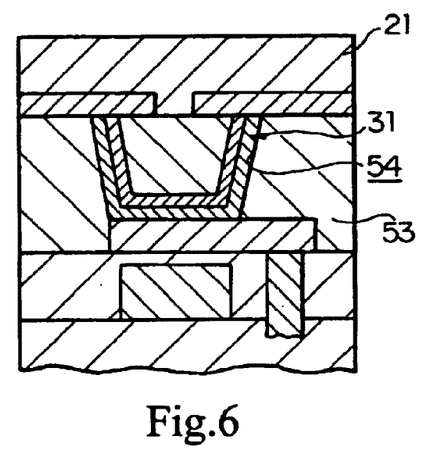
FIG. 6 is a schematic configuration sectional view showing a modification of the concave portion.

Further, as shown in FIG. 6, a side wall of the concave portion 56 formed in the second insulating film 53 is not necessarily formed as an opening extending perpendicularly to the bottom thereof. The concave portion 54 may be shaped into a form in which the side wall thereof is inclined so that a bore diameter increases in a direction toward the opening. Incidentally, FIG. 6 shows a state in which the information writing device 31 is formed in the concave portion 54, and in which the bit line 21 is formed thereabove.

Figure 4D:
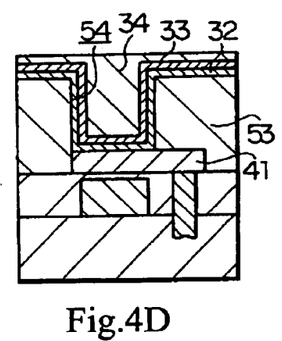

Subsequently, as illustrated in FIG. 4D, the magnetization fixed layer 32 is film-formed from a ferromagnetic material, for example, ferrocobalt (CoFe) or cobalt (Co) or iron (Fe)

on the inner surface of the concave portion 54 and on the second insulating film 53 by film-forming techniques, such as CVD method or PVD method. Then, the tunnel insulating layer 33 is film-formed from, for instance, alumina oxide. Subsequently, the storage layer 34 is film-formed from a ferromagnetic material, such as ferrocobalt (CoFe). Thus the multilayered film is formed. At that time, the film is formed by selecting the film thickness of each of the layers so that the filling-in of the concave portion 54 is completed by forming the storage layer 34.

Thus, each of the films is formed by CVD method or PVD method after the concave portion 54 is formed. Consequently, each of the films is formed almost in parallel to the inner surface of the concave portion 54.

Although each of the magnetization fixed layer 32, the tunnel insulating layer 33, and the storage layer 34 is formed from a single layer film in the example of the film-forming, each of the magnetization fixed layer 32, the tunnel insulating layer 33, and the storage layer 34 can be formed from a multilayered film obtained by stacking a plurality of films.

Figure 4E:
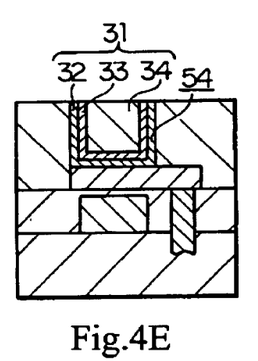

Thereafter, excessive multilayered films formed on the second insulating film 53 is removed by the chemical mechanical polishing and the dry etching. Thus, as shown in FIG. 4E, the information storage device 31 consisting of the magnetization fixed layer 32, the tunnel insulating layer 33, and the storage layer 34 is formed in the concave portion 54. The chemical mechanical polishing is performed by using a mixture, which includes alumina or silica as an abrasive and also includes a hydrogen peroxide solution, an ammonium pursulfate, or ozone water as an oxidant and has a pH ranging from 3 to 10, preferably, from 4 to 8, and more preferably, from 5 to 7, as a slurry for polishing the magnetization fixed layer 32, and the storage layer 34, which are made mainly of iron (Fe), cobalt (Co), and nickel (Ni). Additionally, corrosion-proofing and flatness-enhancement can be performed by admixing benzotriazole (BTA) serving as an anticorrosive, and a quinaldic acid and glycin as a complex-forming agent with the mixture. Polishing pad employing nonwoven cloth or resins, such as foamed polyurethane, is used. Mixture, which includes alumina or silica as an abrasive and has a pH ranging from 5 to 11, preferably, from 7 to 10, is used as a slurry for polishing the tunnel insulating layer 33 formed from alumina oxide. Polishing pad employing nonwoven cloth or resins, such as foamed polyurethane, is used. Incidentally, usually, the tunnel insulating layer 33 is constituted by a very thin film. Therefore, the slurry for polishing the magnetization fixed layer 32 and the storage layer 34 may be also used therefor.

Figure 4F:
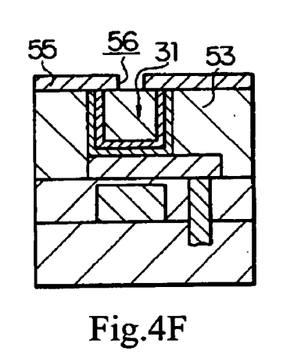

Subsequently, as shown in FIG. 4F, the third insulating film 55 is formed on the second insulating film 53 in such a way as to cover the information writing device 31. Thereafter, the opening portion 56 leading to the information writing device 31 is formed on the third insulating film 55 by using the lithography and etching techniques.

Figure 4G:
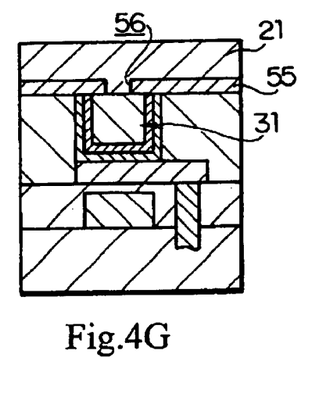

Subsequently, as illustrated in FIG. 4G, a film for forming bit lines connected to the information writing device 31 through the opening portion 56 is film-formed by using the film-forming techniques, such as PVD method or CVD method. Then, the bit line 21 connected to the information writing device 31 is formed by processing the film through the lithography and etching techniques. This bit line 21 is formed in such a way as to extend perpendicularly to the write word line 11.

According to the method of manufacturing the information storage apparatus, the formation of the concave portion 54 for forming each of the information writing device 31 is enabled by etching the second insulating film 53 of a single layer, which is easy to perform as a dry etching technique. Further, as compared with the information writing device of the conventional multilayered structure, the contact area between the magnetization fixed layer 32 and the tunnel insulating layer 33 or between the tunnel insulating layer 33 and the storage layer 34 can be set to be large. That is, the resistance value of each of the information writing device 31 can be reduced. Consequently, reduction in the size, voltage, and power consumption of the device are enabled.

Figure 7:
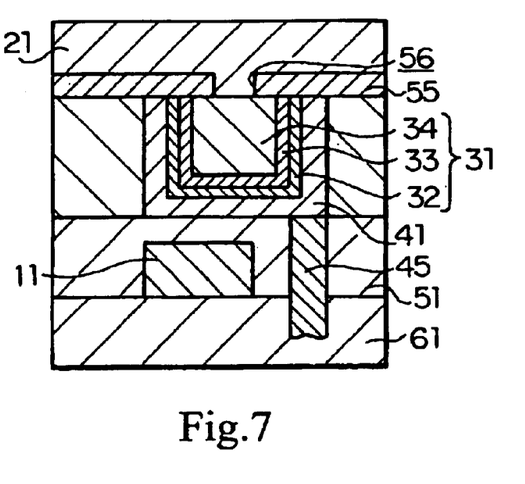
FIG. 7 is a schematic configuration sectional view showing a second mode for carrying out of the information storage apparatus according to the invention.

Next, a second mode for carrying out of the information storage apparatus according to the invention is described by referring to a sectional configuration view of FIG. 7.

As shown in FIG. 7, transistor devices (not shown) of a read circuit are formed on a semiconductor substrate (not shown). Foundation insulating film 61 for covering the semiconductor devices is also formed thereon. Write word line 11 is formed on this foundation insulating film 61. Further, the first insulating film 51 for covering this write word line 11 is formed on the foundation insulating film 61. On the first insulating film 51, the contact 45 connected to a read circuit portion (not shown) is formed. Furthermore, the second insulating film 53 is formed on the first insulating film 51.

Further, in the second insulating film 53 serving as an intersection region between the write word line 11 and a bit line 21 (to be described later), a concave portion 54 having a bottom part, to which the contact 45 is exposed, is formed. In this concave portion 54, the information storage device 31 is formed through a conductive layer 41 including an antiferromagnetic layer. In this concave portion 54, for example, the conductive layer 41 is formed, and moreover, a multilayered film consisting of a magnetization fixed layer 32 formed from, for example, a ferromagnetic, a tunnel insulating layer 33, and a storage layer 34 formed from a ferromagnetic is formed, so that these layers are arranged in this order from the wall surface of the concave portion. This multilayered film constitutes the information storage device 31. Furthermore, the storage layer 34, which is a top layer, completely is filled in the concave portion 54.

The conductive layer 41, the magnetization fixed layer 32, the tunnel insulating layer 33, and the storage layer 34 are formed from similar materials of the corresponding layers of the embodiment described with reference to FIG. 1. Furthermore, the storage layer 34 is formed in such a manner as to have a preferred axis for a magnetization direction, which is an easy axis of magnetization (EA).

The third insulating film 55 is formed on the second insulating film 53 in such a manner as to cover the information storage device 31. In the third insulating film 55 formed on the information storage device 31, an opening portion 56 is formed.

On the third insulating film 55, the bit line 21 to be spaced a predetermined distance away from the write word line 11 is formed. This bit line 21 is connected to the storage layer 34 of the information storage device 31 through the opening portion 56.

In the information storage apparatus 2, the multilayered film constituting the information storage device 31, that is, the magnetization fixed layer 32, the tunnel insulating layer 33, and the storage layer 34 are formed in such a manner as to be filled in the concave portion 54. Thus, as compared with the information writing device of the conventional multilayered structure, the contact area between the magnetization fixed layer 32 and the tunnel insulating layer 33 or between the tunnel insulating layer 33 and the storage layer 34 can be set to be large. That is, the resistance value of each of the information writing device 31 can be reduced. Consequently, the reduction in the size, voltage, and power consumption of the device are enabled.

Next, a manufacturing method according to the second mode for carrying out is described hereinbelow.

As described with reference to FIG. 4A, the write word line 11 is formed on the foundation insulating film 61. Then, the first insulating film 51 is formed. Subsequently, the contact 45 is formed on the first insulating film 51.

Then, the second insulating film 53 is formed on the first insulating film 51. Thereafter, similarly as described with reference to FIG. 4C, a concave portion 54 is formed. At that time, the concave portion 54 is formed so that the first insulating film 51 is left between the concave portion 54 and the write word line 11, and that the top surface of the contact 45 is exposed to the bottom part of the concave portion 54.

Subsequently, the conductive layer 41 including an antiferromagnetic layer is formed on the inner surface of the concave portion 54 and the second insulating film 53. Further, the magnetization fixed layer 32 is film-formed from ferromagnetic materials, for example, ferrocobalt (CoFe), or cobalt (Co), or iron (Fe). Subsequently, the tunnel insulating layer 33 is film-formed from, for instance, alumina oxide. Moreover, the storage layer 34 is film-formed from a ferromagnetic material, such as ferrocobalt (CoFe). Thus, a multilayered film is formed. At that time, the film-forming is performed by selecting the film thickness of each of the layers so that the filling-in of the concave portion 54 is completed by forming the storage layer 34.

Thus, the films are formed nearly in parallel to the inner surface of the concave portion 54 by forming the films through CVD method or PVD method.

Thereafter, excessive conductive film 41 and the multilayered film formed on the second insulating film 53 are removed by chemical mechanical polishing or dry etching. Thus, the information storage device 31 consisting of the magnetization fixed layer 32, the tunnel insulating layer 33, and the storage layer 34 is formed through the conductive film 41 including an antiferromagnetic layer is formed in the concave portion 54. The chemical mechanical polishing is performed by using a mixture, which includes alumina or silica as an abrasive and also includes a hydrogen peroxide solution, an ammonium pursulfate, or ozone water as an oxidant and has a pH ranging from 3 to 10, preferably, from 4 to 8, and more preferably, from 5 to 7, as a slurry for polishing the magnetization fixed layer 32, and the storage layer 34, which are made mainly of iron (Fe), cobalt (Co), and nickel (Ni). Additionally, corrosion-proofing and flatness-enhancement can be performed by admixing benzotriazole (BTA) serving as an anticorrosive, and a quinaldic acid and glycin as a complex-forming agent with the mixture. Polishing pad employing nonwoven cloth or resins, such as foamed polyurethane, is used. Mixture, which includes alumina or silica as an abrasive and has a pH ranging from 5 to 11, preferably, from 7 to 10, is used as a slurry for polishing the tunnel insulating layer 33 formed from alumina oxide. Polishing pad employing nonwoven cloth or resins, such as foamed polyurethane, is used. Incidentally, usually, the tunnel insulating layer 33 is constituted by a very thin film. Therefore, the slurry for polishing the magnetization fixed layer 32 and the storage layer 34 may be also used therefor.

Thereafter, similarly as described with reference to FIGS. 4F and 4G, the third insulating film 55, the opening portion 56, and the bit line 21 are formed. Thus the information storage apparatus 2 is formed.

The second mode for carrying out can obtain operations and advantages similar to those of the first mode for carrying out. Further, because the conductive layer 41 is formed in the concave portion 54, a process of patterning the conductive layer can be omitted. Consequently, reduction in the number of processes can be realized.

Further, in the manufacturing method according to each of the modes for carrying out, a removal condition for removing excessive films formed on the second insulating film 53 may be set for each of the films. Alternatively, a condition for collectively removing the excessive film may be set. The layers formed on the second insulating film are removed after a three-layer film (the first embodiment) or a four-layer film (the second embodiment), which has been described hereinabove, is formed. However, for instance, in the case of the first embodiment, after unnecessary films on the insulating film 53 are removed at the point of time, at which a first layer (for example, the magnetization fixed layer 32) or a second layer (for instance, the tunnel insulating layer 33) is formed, a third layer (for instance, the storage layer 34) may be formed. Further, an unnecessary layer formed on the second insulating film 53 may be removed.

Industrial Applicability

As above-described, according to the information writing device of the invention, the information storage device is constituted by the multilayered film formed in such a way as to be filled in the concave portion. Thus, as compared with the information writing device of the conventional multilayered structure, the contact area between the magnetization fixed layer and the tunnel insulating layer or between the tunnel insulating layer and the storage layer of the device of the invention can be set to be large when the comparison is made on condition that the occupied areas of the devices are equal to each other. Consequently, the resistance value of each of the information writing devices can be reduced. Further, according to the method of manufacturing the information writing device of the invention, the concave portion, in which each of the information writing devices is formed, can be formed by performing etching of the second insulating film of a single layer, which is easy to perform as a dry etching technique. Thus, as compared with the information writing device of the conventional multilayered structure, the contact area between the magnetization fixed layer and the tunnel insulating layer or between the tunnel insulating layer and the storage layer of the device manufactured by the method according to the invention can be set to be large. Consequently, the resistance value of each of the information writing devices can be reduced.

What is claimed is:

1. An information storage apparatus having:
   word lines;
   bit lines each formed in such a way as to intersect with said word lines at predetermined intervals; and
   information storage devices each comprising a multilayered film that includes at least a magnetization fixed layer made of ferromagnetic material, a tunnel insulating layer, and a storage layer made of ferromagnetic material, provided between said word line and said bit line in an associated one of intersection regions between said word line and said bit line, characterized in that:
   said information storage devices each comprises:
   a concave portion provided in an insulating film formed between said word line and said bit line in an intersection region between said word line and said bit line; and
   said multilayered film formed in said concave portion; wherein:

said multilayered film is composed of a relatively thin deposition of said magnetization fixed layer covering at least a side wall and an adjacent surface of the concave portion, a relatively thin deposition of said tunnel insulation layer covering at least most of the magnetization fixed layer, and the remaining portion of said concave portion is filled with said storage layer, such that said storage layer reaches to the top surface of said insulating film.

2. The information storage apparatus according to claim 1, characterized in that:

said multilayered film is formed along an inner surface of said concave portion; and said concave portion is embedded in a top layer film of said multilayered film.

3. The information storage apparatus according to claim 1, characterized in that:

said information storage device is formed in such a way as to have a length in a direction of said word line, which is longer than that in a direction of said bit line.

4. The information storage apparatus according to claim 1, characterized in that:

said information storage device is formed in such a way as to have a length in a direction of said bit line, which is longer than that in a direction of said word line.

5. The information storage apparatus according to claim 1, characterized in that said concave portions are each shaped into a form in which a side wall thereof is formed in such a manner as to be inclined so that a bore diameter increases in a direction toward an opening.

6. The information storage apparatus according to claim 1, characterized in that an antiferromagnetic layer connected to said information storage device is provided on a word-line side of said information storage device.

7. The information storage apparatus according to claim 6, characterized in that said antiferromagnetic layer is formed in said concave portion.

8. The information storage apparatus according to claim 1, characterized in that a conductive layer including an antiferromagnetic layer is previously formed below said concave portion, above said word line, and in contact with said concave portion; and wherein a contact layer connected to a read circuit is previously formed below and in contact with said conductive layer.

9. An information storage apparatus comprising:

upper and lower conductive members;

a concave region formed in an insulating layer between the upper and lower conductive members;

a thin magnetization fixed layer made of ferromagnetic material covering at least a side wall and an adjacent surface of the concave portion;

a relatively thin tunnel insulation layer covering at least most of the magnetization fixed layer, and a storage layer comprised of ferromagnetic material filling in a remaining portion of the concave region.

10. The information storage apparatus of claim 9, wherein the concave region has at least a portion of a surface comprised of a conductive member.

* * * * *